(12) United States Patent
Choi

(10) Patent No.: US 6,794,859 B2
(45) Date of Patent: Sep. 21, 2004

(54) AUTOMATIC MULTIMETER

(76) Inventor: Sang J. Choi, 2425 W. 183rd St., Homewood, IL (US) 60430

( * ) Notice: Subject to any disclaimer, the term of this patent is extended or adjusted under 35 U.S.C. 154(b) by 0 days.

(21) Appl. No.: 10/299,845

(22) Filed: Nov. 20, 2002

(65) Prior Publication Data
US 2004/0095124 A1 May 20, 2004

(51) Int. Cl.[7] .................. G01R 15/00; G01R 17/06
(52) U.S. Cl. ........................... 324/115; 324/99 D
(58) Field of Search ................. 324/99 D, 110, 324/115–116, 117 H, 103 R

(56) References Cited

U.S. PATENT DOCUMENTS

| | | | | |
|---|---|---|---|---|
| 4,789,824 A | * | 12/1988 | Henkelmann | 324/114 |
| 5,119,019 A | * | 6/1992 | George | 324/115 |
| 5,530,373 A | * | 6/1996 | Gibson et al. | 324/115 |
| 5,578,936 A | * | 11/1996 | Gibson et al. | 324/767 |
| 5,581,175 A | * | 12/1996 | Yoneyama et al. | 324/115 |
| 5,705,936 A | * | 1/1998 | Gibson et al. | 324/115 |
| 6,043,640 A | * | 3/2000 | Lauby et al. | 324/117 H |
| 6,094,045 A | * | 7/2000 | Zoellick | 324/115 |
| 6,380,726 B1 | * | 4/2002 | Szabo | 324/115 |
| 6,466,003 B1 | * | 10/2002 | Gallavan et al. | 324/115 |
| 6,556,003 B2 | * | 4/2003 | Choi | 324/99 D |

* cited by examiner

Primary Examiner—Kamand Cuneo
Assistant Examiner—Jermele Hollington

(57) ABSTRACT

To measure a resistance value in a circuit by conventional method, one side of the resistor should be disconnected from the circuit, then an Ohmmeter is connected across the resistor. To measure a current through a component, one side of the component should be disconnected and an ammeter is connected between the 2 open terminals. As such mentioned above, measuring a resistance value or a milliamp current value is very inconvenient with a conventional multimeter. With the present invention, a voltage, a current, and a resistance can be measured altogether at the same time automatically without manually disconnecting a component in a circuit with 2 or more resistors connected in series.

4 Claims, 3 Drawing Sheets

AUTOMATIC MULTIMETER

BACKGROUND

With the most conventional multimeters, a voltage measurement is quite easy. However, to measure a current in a circuit, one side of the component should be disconnected and a current meter is connected between the 2 open terminals. To measure a resistance value in a circuit, one side of the resistor should be disconnected from the circuit and an Ohmmeter is connected across the resistor, and measures the resistance. Disconnecting one side of a component means unsoldering the component. After finishing the measurement, the component must be connected back by soldering it to original state. There is a current meter, called clamp meter, which can be used to measure a current without opening a circuit and connecting the meter between the open terminals. However, the meter can be used to measure very high current, most cases in several amps in an electrical circuit. It can not be used in an electronic circuit where a current value is normally miliamp range. To avoid those inconveniences disconnecting a component from a circuit and reconnecting the component back in the circuit, the present invention is developed for a circuit where 2 or more resistors are connected in series. The present invention also can be applied to analyze a transistor circuit.

SUMMARY

This invention is to facilitate measurements of voltage, current, and resistance in an electronic series circuit. All 3 values are measured simultaneously. Therefore, the 3 functions together are defined as a VOM function. It is not necessary to disconnect any side of a component to measure a current or a resistance in a series resistors circuit. A voltage is measured across a component in conventional way by a typical voltmeter function. By default, all switches connected in series with all parallel range resistors of the VOM function are open state. To measure a resistance without disconnecting the resistor, firstly, measure V+ (supply voltage of the circuit under test), and measure the voltage across the load resistor, designate this voltage as $V_L$, and put the highest parallel range resistor ($R_P$) in parallel with the load resistor by activating the appropriate switch, then measure the voltage appearing across 2 parallel connected components, load resistor and the parallel resistor, define this voltage as $V_P$. If the $V_P$ is lower than the predetermined percentage of $V_L$, calculate the value of $R_L$ (load resistance) by using the values of V+, $V_L$, $V_P$, and $R_P$. If the $V_P$ is higher than the predetermined percentage of $V_L$, then open the highest parallel resistor by deactivating the series switch, and connect the next highest range resistor in parallel with the load resistor by activating the appropriate switch, and continue the process same as performed with the highest resistor. Repeat changing the parallel resistors until it finds an appropriate range at which $V_P$ is lower than the predetermined percentage of $V_L$. Then, compute the value of $R_L$, by using $V_L$, $V_P$, V+, and $R_P$. After $R_L$ is found, calculate the current of the load resistor ($I_L$) by the equation, $I_L = V_L/R_L$.

For the circuit where a single resistor is connected directly across a power supply, the above theory can not be applied, and conventional method must be used for the measurements of a current and a resistance. To measure a resistance for the one resistor circuit, one side of the resistor should be disconnected from the circuit and measure the resistance.

For the measurement of a current for one resistor connected across a power supply, one side of the component should be disconnected and a current meter is connected between the 2 open terminals, and measure the current in conventional way. If 2 or more resistors connected in parallel between 2 nodes and they are connected in series with another resistor, the same principle of the present invention can be applied. However, this approach measures a total resistance and a total current between the 2 nodes. To measure individual branch current of a parallel circuit, the conventional method of current measurement and resistance measurement method should be applied.

BRIEF DESCRIPTION OF THE DRAWINGS:

The detailed description generated by following accompanying drawings will help better understand the present invention.

DETAILED DESCRIPTION OF THE INVENTION

A multimeter of the present invention has 5 functions, VOM (Voltage, Ohm, Milliamp) function, I (Current) only function, R (Resistance) only function, V (Voltage) only function, and AC measurement function. VOM function measures Voltage, Resistance, and Current at the same time automatically for the circuits shown in FIG. 3, FIG. 6, and FIG. 7. I (current) only function measures only a current like a conventional current meter for the circuits shown in FIG. 4 and FIG. 8. R (resistance) only function measures a resistance value like a conventional Ohmmeter for circuits shown in FIG. 5 and FIG. 9.

Figure 1:
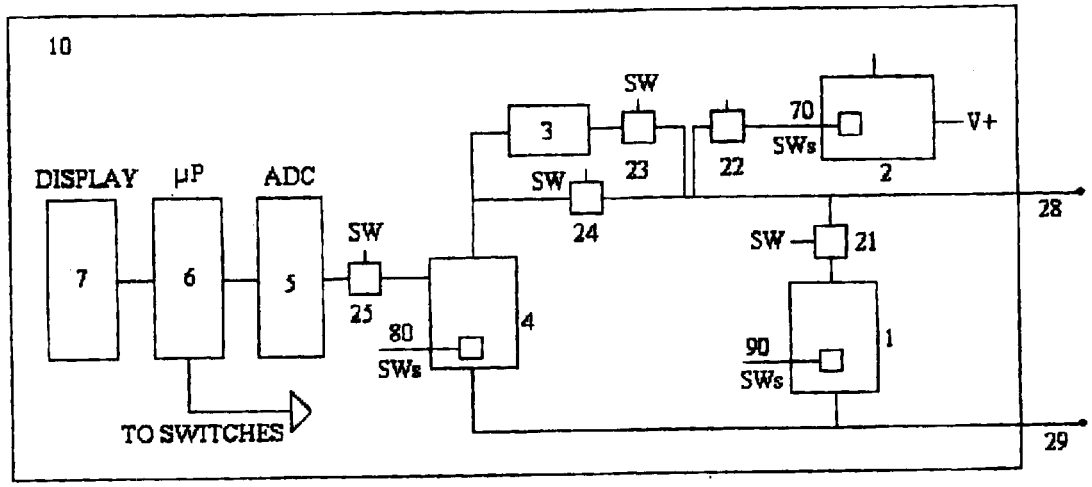
FIG. 1 is a block diagram illustrating various important features of an automatic multimeter of the present invention.

Referring to FIG. 1, it shows a block diagram of an automatic multimeter (10). Elements, (24), (23), (22), and (21) are function switches for DC voltage, AC voltage, VOM (Voltage Ohm Milliamp) or current only, and resistance only functions respectively. With Volt, Ohm, Milliamp (VOM) function, a voltage, a current and a resistance values are found at the same time across a component in a circuit where 2 or more resistors are connected in series. Element (4) contains voltage range selector circuit. It includes as many switches as there are different ranges. A switch is selected and activated by a microprocessor (6). To measure a voltage, the microprocessor activates SW (24) and selects a range by activating one switch from the switch group (80).

The measured analog voltage is applied to ADC (5) through the SW (25), which is a protective device for the ADC (5). The digitally converted value is applied to the microprocessor (6).

The microprocessor (μP) (6) manipulates and processes the data and displays the data on the display unit (7).

To measure an AC voltage, the μP (6) activates SW (23) and couples an AC voltage to rectifier and filtering device (3), which comprises a coupling capacitor, a rectifier, a bleeder resistor, and 2 filtering capacitors.

The range means (4) receives a DC value that represents AC equivalent value, and the DC value is processed just like originally DC value through ADC (5), μP (6), and display (7). If, in a series resistor circuit, VOM values are to be measured, firstly, measure V+ for the circuit under test, define this as V+. Next measure the DC voltage across the component $R_L$ (shown in FIG. 2) and define the voltage as $V_L$, activates SW (21), which activates the VOM function and selects the highest resistor ($R_P$) from the parallel resistors group (1) by selecting the appropriate switch from the switch group (90). Measure the voltage across the parallel circuit made of $R_L$ and the parallel resistor ($R_P$), define this voltage as $V_P$. If the measured $V_P$ is higher than the predefined percentage of the $V_L$, open the first switch and select the next highest parallel resistor by activating the appropriate switch. Follow the same process being done with the first resistor. Continue selecting the next higher resistor and measuring $V_P$ across the 2 parallel components. By following this procedure, if there is a measured $V_P$ is lower than the predetermined percentage of $V_L$ then use the $V_L$, the $V_P$, the V+, and the $R_P$ to find load resistance value ($R_L$). From this $R_L$ and $V_L$, determine $I_L$. These processes are done automatically under a program control. There are some circuits where the "VOM" function can not be applied, for instance, a resistor connected directly across a power source. In this kind of situation, a conventional method should be applied by disconnecting one side of the component and connecting an Ohmmeter across the component, and measures the resistance. Such as this kind of circumstances, to measure a resistance in conventional way, activate SW (22) which is an Ohm function switch, then select a range from the resistance selector group (2) by activating an appropriate switch from the switch group (70).

The device or the component under test is connected between 2 test probes (28) and (29).

Figure 2:
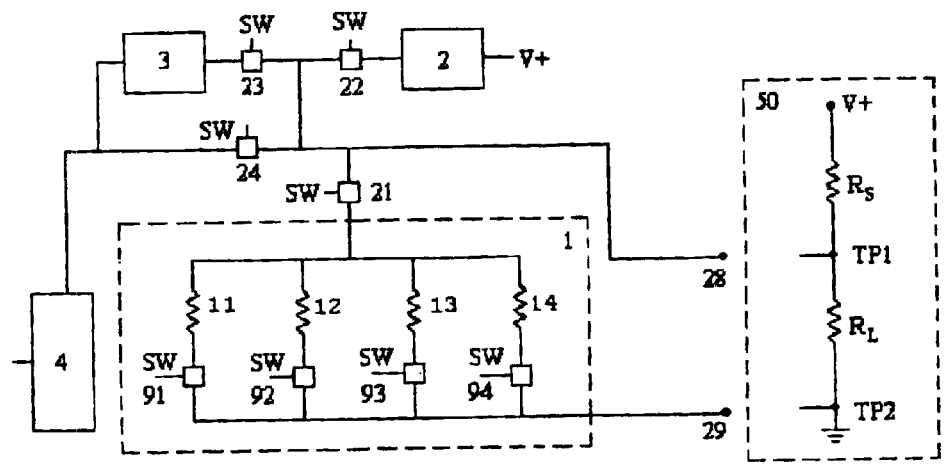
FIG. 2 is a simplified schematic diagram of a range selection circuit for automatic measuring function of Voltage Ohm and Miliamp (VOM).

Regarding FIG. 2, a circuit under test (50) is shown as 2 resistors, Rs and RL, connected in series.

A range selector circuit (1) made of 4 resistors, 11, 12, 13, and 14 are connected in parallel and they are all connected to one side of probe through switches, 91, 92, 93, and 94. In this circuit, 4 branches are shown, but it can include any number of branches.

To measure $R_L$ resistance inside (50), firstly, measure V+ of the load circuit inside (50), secondly, connect probes 28 and 29 to TP1 and TP2 respectively, then activates SW (24), measure the voltage and designate the voltage as $V_L$, then activates SW (21) and SW (91). This will put the highest resistor (11) in parallel with $R_L$ (Load resistor), then measure the voltage across 2 paralleled resistors, and designate this as $V_P$. If the $V_P$ value is less than the predetermined percentage of $V_L$, then determine the $R_L$ value with the data V+, $V_L$, $V_P$, and R (11). If the $V_P$ value is above the predetermined percentage of $V_L$, then continue with the next higher parallel resistor (12) by activating SW (92). SW (22) activates resistance range selector (2) to measure a resistance of a resistor, which is directly connected across power supply by itself SW (23) activates filter/rectifier circuit (3) for AC measurement.

Figure 3:
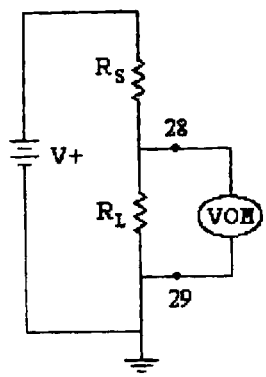
FIG. 3 is a typical series resistors circuit for which the present invention can be used most effectively to measure Voltage, Ohm, Milliamp (VOM).

FIG. 3 shows the connection of the meter for the "VOM" function, which measures a voltage, a resistance, and a current in a series circuit of $R_S$ and $R_L$.

Figure 4:
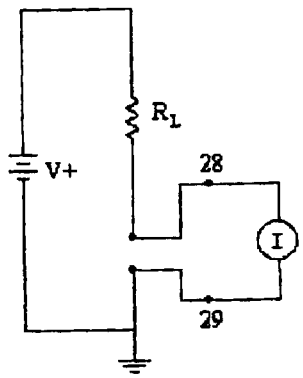
FIG. 4 shows a circuit where a resistor is connected directly across a power source. A current is measured in a conventional method by opening one side of the resistor.

FIG. 4 shows the meter connection of I (current) only function for a single resistor circuit connected directly across a power supply. This measurement is the same as the conventional current measurement, disconnecting one terminal of the component ($R_L$).

Figure 5:
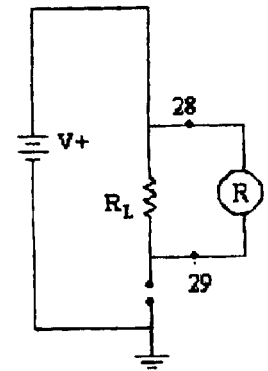
FIG. 5 shows how to measure a resistance, which is connected across power supply.

FIG. 5 shows the meter connection of the R (resistance) function for a circuit with only one resistor connected across a power supply. It shows that one side of the component terminal is disconnected.

Figure 6:
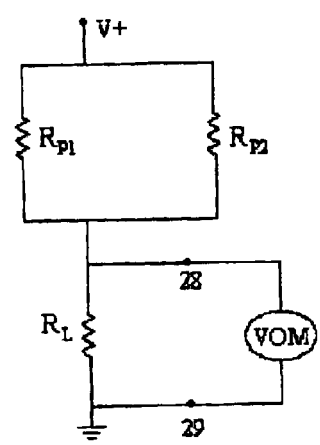
FIG. 6 shows how to measure V, O, and M across a series resistor in a series parallel circuit.

FIG. 6 shows another connection of VOM function for a series parallel circuit. The meter measures a voltage, a resistance, and a current across the load resistor ($R_L$)

Figure 7:
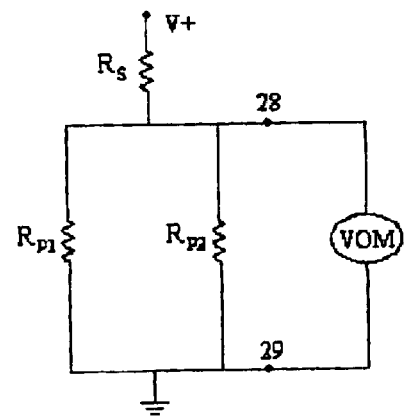
FIG. 7 shows how to measure total values of V, O, and M across 2 nodes where 2 or more resistors are connected in parallel.

FIG. 7 shows another connection of VOM function, which measures total voltage, total current, and total resistance across the parallel circuit of $R_{P1}$ and $R_{P2}$.

Figure 8:
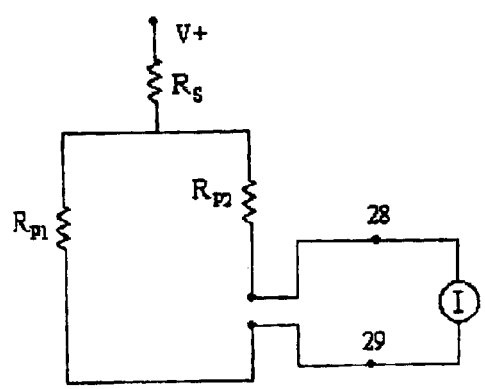
FIG. 8 shows how to measure a branch current in a parallel circuit.

FIG. 8 shows a connection of current function to measure a branch current for a parallel circuit of $R_{P1}$ and $R_{P2}$, which are connected in series with $R_S$.

Figure 9:
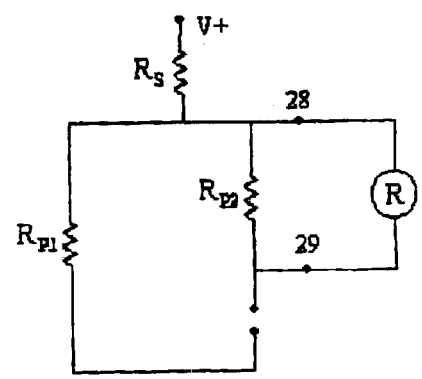
FIG. 9 shows how to measure a resistance for a parallel connected circuit.

FIG. 9 shows a connection of resistance function to measure a branch resistor for 2 resistors parallel circuit of $R_{P1}$ and $R_{P2}$. The circuit shows that one side of the component is open.

In the broader aspects, this invention is not limited to the specific embodiment illustrated and described herein. Those skilled in the art may make various changes and modifications without departing from the scope and sprit of the present invention. It is the expressed intention of this invention to embrace all such changes and modifications which fall within the scope of the described claims thereby.

What I claim is:

1. An automatic multimeter apparatus which measures automatically a voltage (Volt), a resistance (Ohm), and a current (Milliamp) simultaneously, which are together defined as VOM function, across 2 nodes in series resistors circuit under test, wherein said apparatus comprising:
    a) a VOM function range selecting means comprised of parallel resistors and switching circuit for selecting an appropriate range for:
        a1) a resistance measurement without disconnecting any side of the resistor(s) under test across which a resistance is to be measured, and
        a2) current measurement without disconnecting any side of the resistor(s) under test, through which a current is to be measured;
    b) voltage range selecting means to select an appropriate range for the measurement of a voltage.

2. An automatic multimeter apparatus according to claim 1, wherein said apparatus further comprising:
    a) a resistance range selecting means to select an appropriate range for the measurement of a resistance only function;
    b) a current range selecting means for a current only function, which is the same as that of the VOM function;
    c) an ADC for converting a measured analog value to a digital value;
    d) a microprocessor for processing measured data and controlling instructions;
    e) a display for displaying measured data on the screen;

f) an AC voltage converting means to convert an AC value to a DC value.

3. A method for a multimeter to measure automatically a resistance and a current in a circuit where 2 or more resistors are connected in series, wherein said method comprising steps of:
   a) measuring a resistance without disconnecting any side of the resistor(s) across which the resistance is to be measured; and
   b) measuring a current without opening any side of the resestor(s) through which the current is to be measured.

4. The method of a multimeter for measuring a resistance and a current without opening the load resistor according to claim 3, wherein said method further comprising steps of:
   a) selecting and connecting an appropriate VOM range resistor in parallel with the load resistor(s) under test;
   b) measuring a voltage across the parallel circuit;
   c) repeating above processes, (a) and (b), until the measured voltage reaches to a predetermined level; and
   d) using the last measured voltage to calculate the current and the resistance of the load resistor(s).

* * * * *